(12) United States Patent
Hong

(10) Patent No.: US 11,205,491 B1
(45) Date of Patent: Dec. 21, 2021

(54) READING REFERENCE CURRENT AUTOMATIC REGULATION CIRCUIT OF NON-VOLATILE MEMORY

(71) Applicant: Shanghai Huali Microelectronics Corporation, Shanghai (CN)

(72) Inventor: Liang Hong, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 16/951,018

(22) Filed: Nov. 18, 2020

(30) Foreign Application Priority Data

Aug. 18, 2020 (CN) .......................... 202010831332.X

(51) Int. Cl.
  *G11C 7/00* (2006.01)
  *G11C 16/26* (2006.01)
(52) U.S. Cl.
  CPC ................... *G11C 16/26* (2013.01)
(58) Field of Classification Search
  CPC ....... G11C 7/1051; G11C 7/22; G11C 7/1072; G11C 7/1006; G11C 7/1066
  USPC ........................................ 365/189.14, 189.15
  See application file for complete search history.

(56) References Cited

U.S. PATENT DOCUMENTS

| | | | |
|---|---|---|---|
| 10,242,733 B2 * | 3/2019 | Nii ...................... | G11C 11/419 |
| 2009/0172481 A1 * | 7/2009 | Cornwell ............... | G11C 16/06 714/721 |
| 2020/0192759 A1 * | 6/2020 | Hwang ................. | G06F 11/102 |

* cited by examiner

*Primary Examiner* — Son T Dinh
(74) *Attorney, Agent, or Firm* — Banner & Witcoff, Ltd.

(57) ABSTRACT

The disclosure discloses a reading reference current automatic regulation circuit of a non-volatile memory. A reading check control module initiates a reading operation, a row reading operation is performed by controlling the memory to switch gate voltage of memory cells to bias gate voltage row by row, a comparison result between a memory cell readout value and an expected value is received, the reading check control module determines whether a reading check is passed according to the comparison result, a reading reference current control module adjusts the digital regulation signal according to whether the reading check is passed, and thus the magnitude of the reading reference current is adjusted through the digital-to-analog conversion module. The disclosure can adaptively regulate the internal reading reference current according to the process threshold voltage deviation in the test and meet the requirements on the function and reliability of the non-volatile memory.

9 Claims, 5 Drawing Sheets

READING REFERENCE CURRENT AUTOMATIC REGULATION CIRCUIT OF NON-VOLATILE MEMORY

CROSS-REFERENCES TO RELATED APPLICATIONS

This application claims priority to Chinese Patent Application No. 202010831332.X, filed on Aug. 18, 2020, and entitled "Reading Reference Current Automatic Regulation Circuit of Non-Volatile Memory", the disclosure of which is incorporated herein by reference in entirety.

TECHNICAL FIELD

The disclosure relates to a non-volatile memory and in particular to a reading reference current automatic regulation circuit of a non-volatile memory.

BACKGROUND

A common readout method of a non-volatile memory is as follow: after the readout current of a memory cell is compared with internal reading reference current through a sense amplifier, the value of '0' or '1' is read out according to the magnitude of the current. The corresponding readout current is recorded as high readout current I0 and low readout current I1. The high readout current I0 is greater than the reading reference current, and the low readout current I1 is smaller than the reading reference current. Since the memory cell is in a saturation region during reading-out, a relationship among readout saturation current $I_{cell}$ corresponding to the high readout current I0 of the memory cell, gate-to-source voltage $V_{gs}$ and initial threshold voltage $V_{th}$ is as follow:

$$I_{cell} \propto (V_{GS} - V_{th})^2 \quad \text{(formula 1)}$$

The threshold voltage of the non-volatile memory cell is an important index to characterize the data storage capacity of the memory cell. The change of the absolute value of the threshold voltage $V_{th}$ of the memory cell influences the data holding time of the non-volatile memory. When the memory cell has just been erased or programmed, the absolute value of the initial threshold voltage of the memory cell is operated to a relatively large value; as time elapses or operation times increase, the energy storage capacity of the memory cell gradually decreases, the threshold voltage also gradually decreases, and the corresponding readout current of the memory cell decreases. For the memory, it is specifically reflected as that the readout saturation current Ica' expected to be greater than the reading reference current is actually smaller than the reading reference current, resulting in a reading error.

For a fixed memory cell, the process of erasing and programming determines the initial threshold voltage, and the process determines the current threshold voltage that the initial threshold voltage may decay to after several years. Therefore, for the memory that has been produced, this part is fixed. Whether the reading reference current of the corresponding sense amplifier is appropriate or not determines whether the readout current of the memory cell under the current threshold voltage can form correct and reliable readout results.

In a conventional way, there is a reference current generation module inside the non-volatile memory, which controls an internal analog circuit to generate different reading reference current by changing the value of the external digital signal. In a chip test, a method for adjusting the reading reference current to a fixed target is usually used. An adjustment target is usually obtained through memory device test data collection and design simulation.

Since device level test results usually cannot be fed back to the design process in time and the design simulation process is based on the SPICE (simulation circuit simulator) model of the existing test results, the above two points cause very slow feedback at the design stage, resulting in that the reading reference current target obtained at the design stage is based on outdated data and the latest process situation cannot be fed back in time. At the same time, in the chip manufacturing process, process deviation is often ubiquitous. Some unexpected process fluctuations in the manufacturing process may cause the threshold voltage during storage to form an offset in the same direction, which correspondingly causes offsets to device readout current and memory readout current windows, resulting in functional failure or reliability failure in the test process, further resulting in that batch chips are discarded. Moreover, since several months are needed for reproduction, not only is a great loss of money caused, but also business opportunities are lost because of the waste of time.

BRIEF SUMMARY

The technical problem to be solved by the disclosure is to provide a reading reference current automatic regulation circuit of a non-volatile memory, which can adaptively regulate internal reading reference current according to a process threshold voltage deviation in a test and meet the requirements on the function and reliability of the non-volatile memory, thus improving the product yield.

In order to solve the above technical problem, the reading reference current automatic regulation circuit of the non-volatile memory provided by the disclosure includes a main control module, a reading check control module, a readout result processing module, a reading reference current control module, a digital-to-analog conversion module, and a signal switching module;

after an external enable signal is received, the main control module sends an internal enable signal to the reading check control module and the reading reference current control module;

the signal switching module is configured to select and output bias gate voltage or conventional gate voltage to a gate of each memory cell according to a bias switching signal output by the reading check control module, and the bias gate voltage is greater than the conventional gate voltage;

the digital-to-analog conversion module is configured to convert a digital regulation signal into reading reference current and output the reading reference current to a memory sense amplifier; the memory sense amplifier is configured to compare the readout current of each memory cell with the reading reference current, and read out '0' or '1' according to the magnitude of the current;

a reading control circuit detects the readout current of the memory cell corresponding to a reading address and outputs the readout current to the memory sense amplifier;

the readout result processing module is configured to compare the readout value of the memory cell corresponding to a reading address of a current reading operation of the reading check control module with an expected value, and output a readout error signal to the reading check control module in case of inconsistency;

the reading check control module, after the internal enable signal is received, performs a traversal reading operation to the memory row by row, outputs a reading address and a reading clock to the reading control circuit, and outputs the bias switching signal to the signal switching module; while the reading address and the reading clock are output to the reading control circuit, enables the signal switching module to output bias gate voltage Vtest to a gate of the memory cell corresponding to the reading address;

the reading check control module, when the traversal reading operation is performed to the memory row by row, stops the current traversal reading operation and sends a reading check error signal to the reading reference current control module if a reading error signal is received, and otherwise completes the traversal reading operation to all addresses of the memory and outputs a reading check pass signal to the reading reference current control module;

the reading reference current control module, after the internal enable signal is received, sends the central value of the digital regulation signal as a current regulation value to the digital-to-analog conversion module; when the reading check pass signal is received, compares the stored optimum value of the digital regulation signal with the current regulation value, updates the optimum value of the digital regulation signal to the current regulation value if the current regulation value is greater than the optimum value of the digital regulation signal, then increases the current regulation value and sends the current regulation value to the digital-to-analog conversion module; when the reading check error signal is received, decreases the current regulation value and sends the current regulation value to the digital-to-analog conversion module.

Preferably, the expected value that the readout current is high readout current I0 is '0';

the expected value that the readout current is low readout current I1 is '1';

the high readout current I0 is greater than the reading reference current, and the low readout current I1 is smaller than the reading reference current;

the readout result processing module only determines bits which are 0 of the expected value when the readout value of the memory cell corresponding to the reading address of the current reading operation of the reading check control module is compared with the expected value.

Preferably, the reading reference current control module adjusts the current regulation value bit by bit based on a bisection method when the reading check pass signal or the reading check error signal is received.

Preferably, the highest bit of the central value is 1, and other bits are 0;

the initial regulation bit of the current regulation value is the highest bit;

increasing the current regulation value refers to changing the next bit of the current regulation bit of the current regulation value from 0 to 1, the regulation ends if all bits of the current regulation value are 1, and otherwise the next bit is used as the current regulation bit;

decreasing the current regulation value refers to changing the current regulation bit of the current regulation value from 1 to 0 and changing the next bit of the current regulation bit from 0 to 1, the regulation ends if all bits of the current regulation value are 0, and otherwise the next bit is used as the current regulation bit.

Preferably, the total number of bits of the digital regulation signal is three and the central value is 100.

Preferably, the reading check control module enables the signal switching module to output the conventional gate voltage to the gate of the memory cell corresponding to the reading address when reading is stopped.

Preferably, the initial value of the optimum value of the digital regulation signal is 0.

Preferably, when the reading check error signal is received after the reading reference current control module increases the current regulation value by 1, or when the reading check pass signal is received after the reading reference current control module decreases the current regulation value by 1, the main control module outputs the optimum value of the digital control signal currently stored in the reading reference current control module as a target reading reference current to the outside.

Preferably, when the reading check error signal is received after the reading reference current control module decreases the current regulation value to 0, the main control module outputs a process failure signal to the outside.

The reading reference current automatic regulation circuit of the non-volatile memory provided by the disclosure is a threshold voltage window adaptive reading reference current automatic regulation circuit. After the external enable signal is received, the central value of the reading reference current digital regulation signal is sent as the current regulation value to the digital-to-analog conversion module, the reading check control module is simultaneously driven to initiate the reading operation, before the reading operation, the reading check control module performs the row reading operation by controlling the memory to switch gate voltage of memory cells to bias gate voltage Vtest row by row, the comparison result between the memory cell readout value of the readout result processing module and the expected value is received, the reading check control module determines whether the reading check is passed according to the comparison result, the reading reference current control module adjusts the digital regulation signal according to whether the reading check is passed, and thus the magnitude of the reading reference current is adjusted through the digital-to-analog conversion module. By repeating the process of reading check operation, reading result check and reading reference current adjustment for many times, after target reading reference current is found, the main control module outputs the target reading reference current to the outside and feeds back a completion signal to an external circuit. When a threshold voltage offset occurs in the process, based on the change of threshold voltage and device current, the reading reference current automatic regulation circuit of the non-volatile memory can adaptively regulate the internal reading reference current according to the process threshold voltage deviation in the test, and meet the requirements on the function and reliability of the non-volatile memory, thus improving the product yield.

BRIEF DESCRIPTION OF THE DRAWINGS

In order to more clearly describe the technical solution of the disclosure, the drawings which need be used in the disclosure will be briefly introduced below. Apparently, the drawings described below are just some embodiments of the disclosure. Those skilled in the art may obtain other drawings according to these drawings without contributing any inventive labor.

DETAILED DESCRIPTION OF THE DISCLOSURE

The technical solution of the disclosure will be described below clearly and completely with reference to the drawings. Apparently, the described embodiments are partial embodiments of the disclosure, instead of all embodiments. Based on the embodiments of the disclosure, all other embodiments obtained by those skilled in the art without contributing any inventive labor shall fall into the scope of protection of the disclosure.

Embodiment 1

Figure 1:
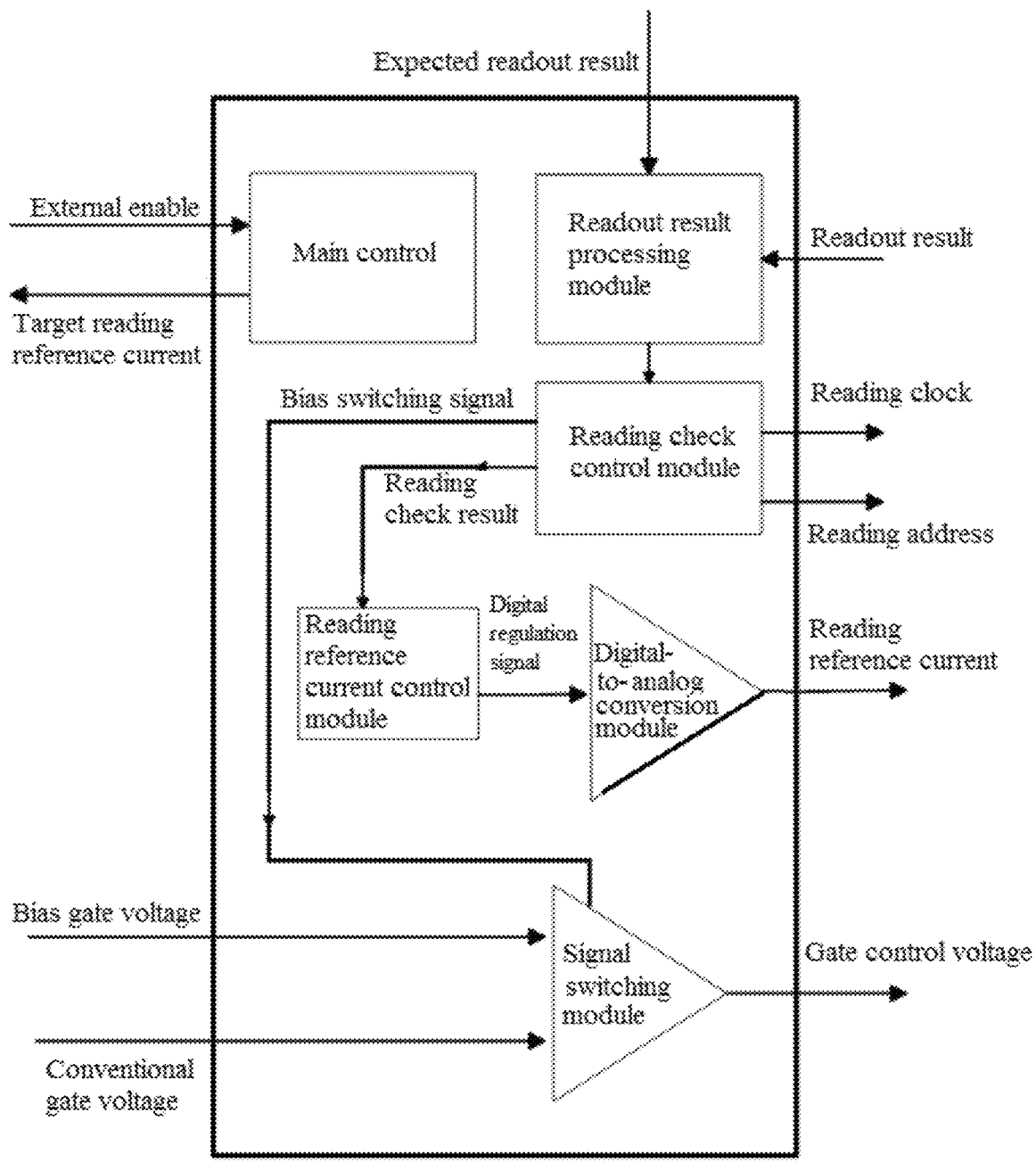
FIG. 1 is a structural schematic diagram of a reading reference current automatic regulation circuit of a non-volatile memory according to one embodiment of the disclosure.

Referring to FIG. 1, a reading reference current automatic regulation circuit of a non-volatile memory includes a main control module, a reading check control module, a readout result processing module, a reading reference current control module, a digital-to-analog conversion module, and a signal switching module;

after an external enable signal is received, the main control module sends an internal enable signal to the reading check control module and the reading reference current control module;

the signal switching module is configured to select and output bias gate voltage or conventional gate voltage to a gate of each memory cell according to a bias switching signal output by the reading check control module, and the bias gate voltage is greater than the conventional gate voltage;

the digital-to-analog conversion module is configured to convert a digital regulation signal into reading reference current and output the reading reference current to a memory sense amplifier;

a reading control circuit detects the readout current of the memory cell corresponding to a reading address and outputs the readout current to the memory sense amplifier;

the memory sense amplifier is configured to compare the readout current of each memory cell with the reading reference current, and read out '0' or '1' according to the magnitude of the current;

the readout result processing module is configured to compare the readout value of the memory cell corresponding to a reading address of a current reading operation of the reading check control module with an expected value, and output a readout error signal to the reading check control module in case of inconsistency;

the reading check control module, after the internal enable signal is received, performs a traversal reading operation to the memory row by row, outputs a reading address and a reading clock to the reading control circuit, and outputs the bias switching signal to the signal switching module; while the reading address and the reading clock are output to the reading control circuit, enables the signal switching module to output bias gate voltage Vtest to a gate of the memory cell corresponding to the reading address;

the reading check control module, when the traversal reading operation is performed to the memory row by row, stops the current traversal reading operation and sends a reading check error signal to the reading reference current control module if a reading error signal is received, and otherwise completes the traversal reading operation to all addresses of the memory and outputs a reading check pass signal to the reading reference current control module;

the reading reference current control module, after the internal enable signal is received, sends the central value of the digital regulation signal as a current regulation value to the digital-to-analog conversion module; when the reading check pass signal is received, compares the stored optimum value of the digital regulation signal with the current regulation value, updates the optimum value of the digital regulation signal to the current regulation value if the current regulation value is greater than the optimum value of the digital regulation signal, then increases the current regulation value and sends the current regulation value to the digital-to-analog conversion module; when the reading check error signal is received, decreases the current regulation value and sends the current regulation value to the digital-to-analog conversion module.

Preferably, the expected value that the readout current is high readout current I0 is '0';

the expected value that the readout current is low readout current I1 is '1';

the high readout current I0 is greater than the reading reference current, and the low readout current I1 is smaller than the reading reference current;

the readout result processing module only determines bits which are 0 of the expected value when the readout value of the memory cell corresponding to the reading address of the current reading operation of the reading check control module is compared with the expected value.

The signal switching module is a conventional analog signal switching circuit;

the digital-to-analog conversion module is a conventional digital-to-analog conversion circuit.

Preferably, when the reading check error signal is received after the reading reference current control module increases the current regulation value by 1, or when the reading check pass signal is received after the reading reference current control module decreases the current regulation value by 1, the main control module outputs the optimum value of the digital control signal currently stored in the reading reference current control module as a target reading reference current to the outside.

Preferably, when the read check error signal is received after the reading reference current control module decreases the current regulation value to 0, the main control module outputs a process failure signal to the outside, indicating that no regulation value can allow the current memory to read out a correct value, i.e., the memory process fails and cannot meet the requirements on the function or reliability.

Figure 2:
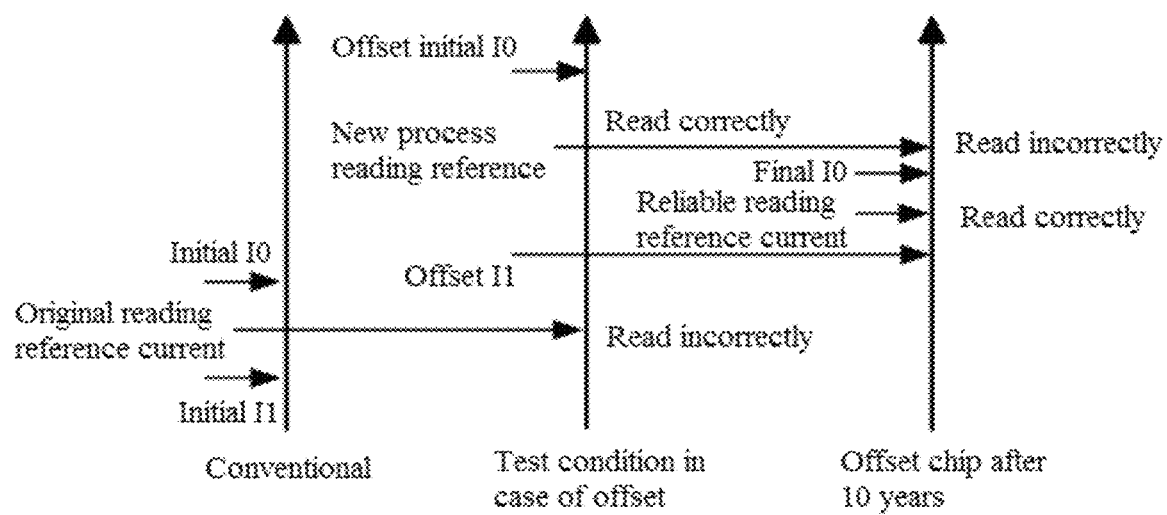
FIG. 2 is a basic schematic diagram of readout failure of a memory cell of a non-volatile memory caused by a threshold voltage offset.

The threshold voltage offset of the non-volatile memory is usually caused by the fluctuation of process conditions, which often results in that the offset to the same direction exceeds the design expectation, resulting in a relatively large change in the corresponding memory cell current under the same readout conditions, which is reflected as the readout failure of the memory cell. The basic principle of the readout failure of the memory cell of the non-volatile memory due to threshold voltage offset is as illustrated in FIG. 2. The situation of memory cells without threshold voltage offset is as illustrated in the left coordinate axis. The original reading reference current is between high readout current I0 and low readout current I1, and the memory readout circuit can work correctly. However, after the threshold voltage offset occurs due to the process conditions, the readout windows formed by the high readout current I0 and the low readout current I1 are offset as a whole, which may cause incorrect readout under the condition of the original reading reference current; if the reading reference current is simply adjusted to new process reference current such that the offset high readout current I0 and low readout current I1 can be read out correctly, then when the non-volatile memory is aged after a long time (for example, 10 years), since the threshold voltage is offset with time normally, the new process reading reference current adopted in the test may not satisfy the readout conditions at this moment, resulting in readout failure again, which cannot guarantee the reliability of non-volatile memory.

Usually, the aged threshold voltage variation Vdecay after the non-volatile memory after aging may be obtained through a device test, and the corresponding aged readout saturation current $I_{cell\_decay}$ is expressed by the following formula:

$$I_{cell\_decay} \propto (V_{GS} - V'_{th})^2 \quad \text{(formula 2)}$$

The relationship between the aged threshold voltage V'th and the initial threshold voltage $V_{th}$ is expressed by the following formula:

$$V'_{th} = V_{th} - V_{decay} \quad \text{(formula 3)}$$

From formula 2 and formula 3, the following can be obtained:

$$I_{cell\_decay} \propto (V_{GS} - V_{th} + V_{decay})_2 \quad \text{(formula 4)}$$

Further transformation, if gate test voltage (bias gate voltage) Vtest is established according to formula 5, formula 4 can be transformed to formula 6.

$$V_{test} = V_{gs} + V_{decay} \quad \text{(formula 5)}$$

$$I_{cell\_decay} \propto (V_{test} - V_{th})^2 \quad \text{(formula 6)}$$

From formula 6, it can be seen that, by adjusting the gate test voltage (bias gate voltage) Vtest during the reading operation in the test process, the readout saturation current corresponding to the high readout current I0 of the aged memory cell can be simulated in the conventional test.

The relationship between the readout result of the non-volatile memory and the reading reference current is as follow:

when the reading reference current is within the ranges of the high readout current I0 and the low readout current I1, the stored 0 and 1 can be correctly read out;

when the reading reference current is greater than the high readout current I0, the stored 0 is incorrectly read out as 1;

when the reading reference current is smaller than the low readout current I1, the stored 1 is incorrectly read out as 0.

Figure 3:
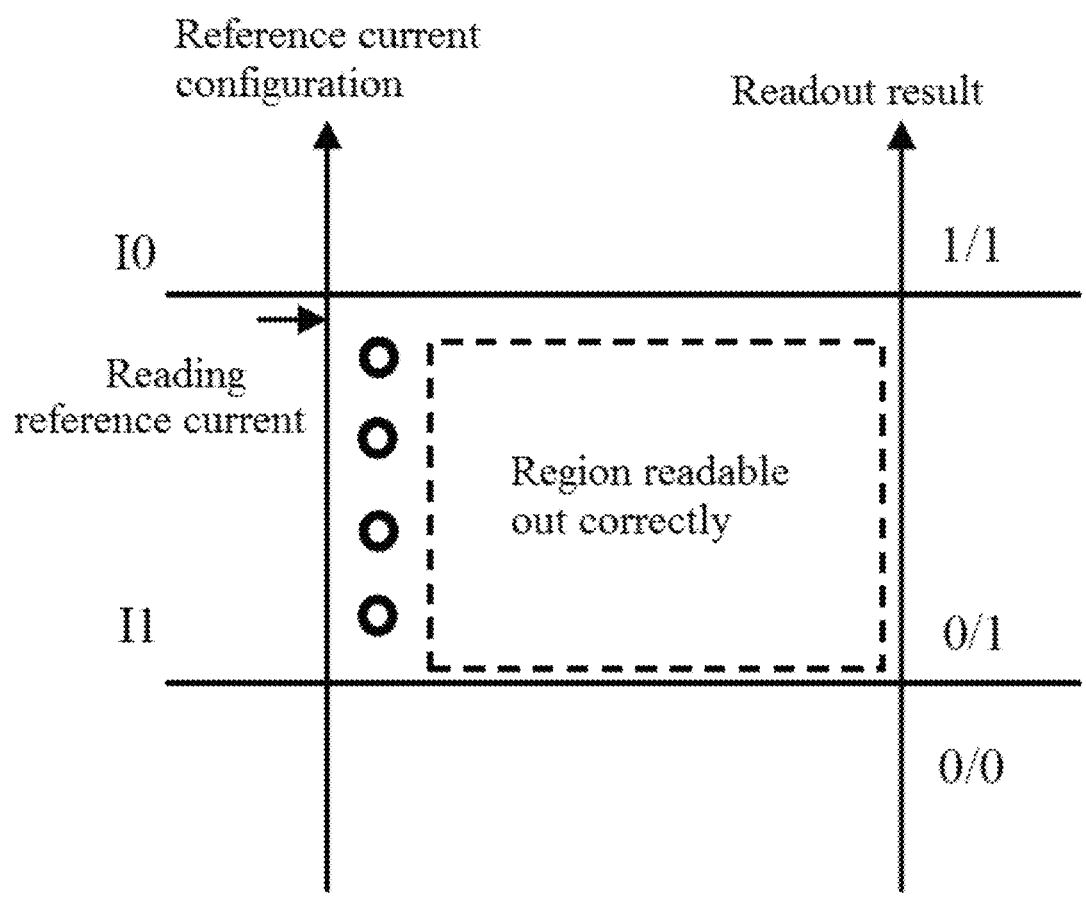
FIG. 3 is a corresponding schematic diagram of reading reference current and a readout result before gate voltage of a memory cell is biased.

When the gate-to-source voltage $V_{gs}$ of the memory cell is not biased, referring to FIG. 3, the left vertical coordinate represents the change of the reading reference current value, and the right represents the change of the readout value. The dashed box area corresponds to the range that can be read out correctly. When the gate voltage of the memory cell is not biased, the change range of the reading reference current is very large.

Figure 4:
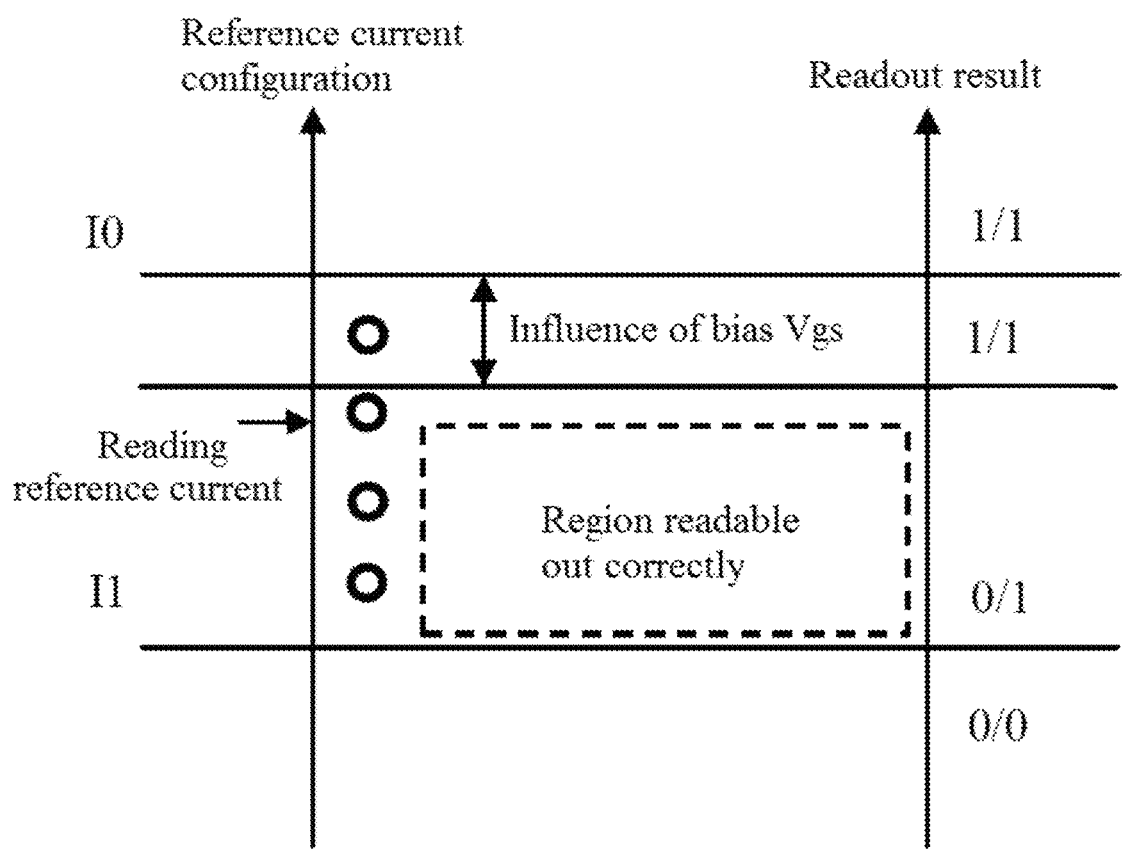
FIG. 4 is a corresponding schematic diagram of reading reference current and a readout result after gate voltage of a memory cell is biased.

When the gate-to-source voltage $V_{gs}$ of the memory cell is biased to the bias gate voltage Vtest, referring to FIG. 4, the reading reference current range that can be correctly read out is reduced. According to the analysis, it is more close to the actual reading situation of the aged memory cell.

From FIG. 3 and FIG. 4, it can be seen that the change situation of the reading reference current can be determined according to whether the readout result is correct.

When the reading reference current changes from small to large, a certain reading reference current result is encountered, which is exactly the last reading reference current that can be correctly read out as 0 and 1; when the reading reference current increases, the reading reference current that make 0 be read out as 1 can exactly meet the requirements on the reliability of the memory.

The reading reference current automatic regulation circuit of the non-volatile memory provided by embodiment 1 is a threshold voltage window adaptive reading reference current automatic regulation circuit. After the external enable signal is received, the central value of the reading reference current digital regulation signal is sent as the current regulation value to the digital-to-analog conversion module, the reading check control module is simultaneously driven to initiate the reading operation, before the reading operation, the reading check control module performs the row reading operation by controlling the memory to switch gate voltage of memory cells to bias gate voltage Vtest row by row, the comparison result between the memory cell readout value of the readout result processing module and the expected value is received, the reading check control module determines whether the check has an error according to the comparison result, the reading reference current control module adjusts the digital regulation signal according to whether the reading check is passed, and thus the magnitude of the reading reference current is adjusted through the digital-to-analog conversion module. By repeating the process of reading check operation, reading result check and reading reference current adjustment for many times, after target reading reference current is found, the main control module outputs the target reading reference current to the outside and feeds back a completion signal to an external circuit. When a threshold voltage offset occurs in the process, based on the change of threshold voltage and device current, the reading reference current automatic regulation circuit of the non-volatile memory can adaptively regulate the internal reading reference current according to the process threshold voltage deviation in the test, and meet the requirements on the function and reliability of the non-volatile memory, thus improving the product yield.

Based on the reading reference current automatic regulation circuit of the non-volatile memory, the test engineer can simulate the situation of the aged non-volatile memory by adopting the method of setting the bias gate voltage according to the process device test result. The circuit can automatically regulate the internal reading reference current, and check the actual reading result to obtain the target reading reference current. For example, when the threshold voltage of the aged non-volatile memory is found to be deviated by 100 mV in the process device test process, the original theoretical bias gate voltage specification is adjusted by 100 mV in the test process, and this part of adjustment directly acts on the automatic regulation process of the circuit, thus matching the change of the memory device.

Embodiment 2

Based on the reading reference current automatic regulation circuit of the non-volatile memory provided by embodiment 1, the reading reference current control module adjusts the current regulation value bit by bit based on a bisection method when the reading check pass signal or the reading check error signal is received.

Preferably, the highest bit of the central value is 1, and other bits are 0;

the initial regulation bit of the current regulation value is the highest bit;

increasing the current regulation value refers to changing the next bit of the current regulation bit of the current regulation value from 0 to 1, the regulation ends if all bits of the current regulation value are 1, and otherwise the next bit is used as the current regulation bit;

decreasing the current regulation value refers to changing the current regulation bit of the current regulation value from 1 to 0 and changing the next bit of the current regulation bit from 0 to 1, the regulation ends if all bits of the current regulation value are 0, and otherwise the next bit is used as the current regulation bit.

Figure 5:
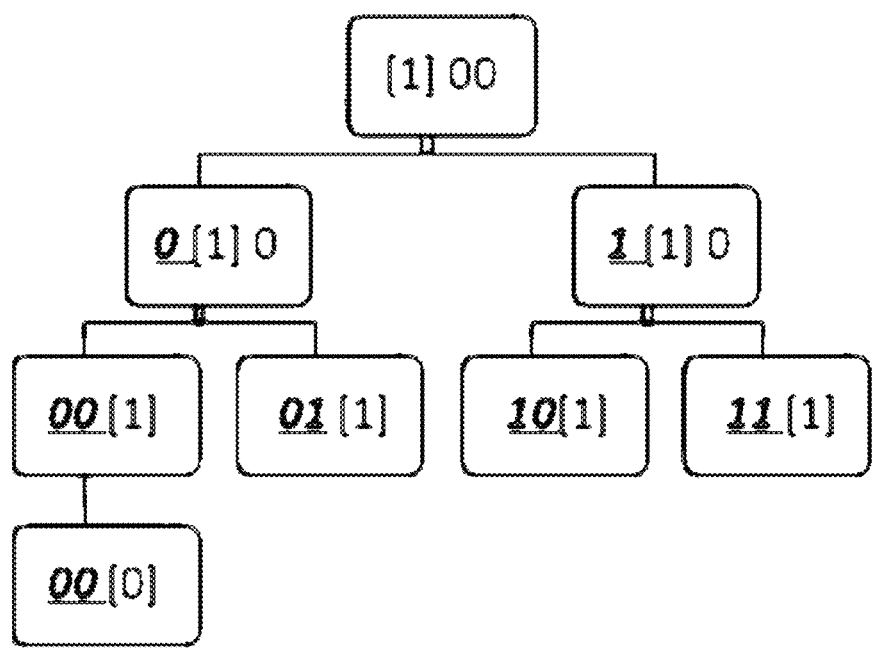
FIG. 5 is a schematic diagram of bit-by-bit adjustment of a 3-bit regulation value of a digital regulation signal based on a bisection method.

Preferably, referring to FIG. 5, the total number of bits of the digital regulation signal is three and the central value is 100.

(1) The bit in the square brackets in FIG. 5 is the current regulation bit, the initial state of the highest layer is 100, and the initial selected bit is the highest bit (bit 2).

(2) Firstly, the initial state is regulated: if the reading check result is pass, the reading reference current control module records the current regulation value, and then the regulation value is set to 110, bit 1 is selected as the next regulation bit, and reading check is continuously performed; if the reading check fails, the regulation value is set to 010 and reading check is performed again.

(3) When the regulation value is set to 001, if a reading check error occurs, it is necessary to add a reading check of 000. If the error still exists, it indicates that no regulation value can allow the current memory to read out a correct value, i.e., it means that there is a process failure, which cannot meet the requirements on the function or reliability.

In the reading reference current automatic regulation circuit of the non-volatile memory provided by embodiment 2, the reading reference current control module is designed based on the bisection method to adjust the current regulation value of the digital regulation signal bit by bit. According to the reading check result, if the reading check result is pass, it indicates that the current regulation value is available, and the next regulation value should be adjusted to increase the reading reference current; if the reading check result is error, it indicates that the reading reference current corresponding to the current regulation value is too large, and the next regulation value should be adjusted to be small.

Embodiment 3

Based on the reading reference current automatic regulation circuit of the non-volatile memory provided by embodiment 1, the reading check control module enables the signal switching module to output the conventional gate voltage to the gate of the memory cell corresponding to the reading address when reading is stopped.

Preferably, the initial value of the optimum value of the digital regulation signal is 0.

Preferably, the reading reference current automatic regulation circuit of the non-volatile memory may be directly embedded in a memory IP or chip.

According to some embodiments, the external enable signal and the expected readout result may be configured by an external control circuit.

According to some embodiments, the bias gate voltage or the conventional gate voltage may be provided externally through the memory or may be provided by an analog-to-digital conversion circuit in an integrated chip.

What are described above are just exemplary embodiments of the disclosure, which are not used to limit the disclosure. Any modification, equivalent replacement, improvement and the like made within the spirit and rule of the disclosure shall be included in the scope of protection of the disclosure.

What is claimed is:

1. A reading reference current automatic regulation circuit of a non-volatile memory, wherein the reading reference current automatic regulation circuit of the non-volatile memory comprises a main control module, a reading check control module, a readout result processing module, a reading reference current control module, a digital-to-analog conversion module, and a signal switching module;

after an external enable signal is received, the main control module sends an internal enable signal to the reading check control module and the reading reference current control module;

the signal switching module is configured to select and output bias gate voltage or conventional gate voltage to a gate of each memory cell according to a bias switching signal output by the reading check control module, and the bias gate voltage is greater than the conventional gate voltage;

the digital-to-analog conversion module is configured to convert a digital regulation signal into reading reference current and output the reading reference current to a memory sense amplifier;

the memory sense amplifier is configured to compare the readout current of each memory cell with the reading reference current, and read out '0' or '1' according to the magnitude of the current;

a reading control circuit detects the readout current of the memory cell corresponding to a reading address and outputs the readout current to the memory sense amplifier;

the readout result processing module is configured to compare the readout value of the memory cell corresponding to a reading address of a current reading operation of the reading check control module with an expected value, and output a readout error signal to the reading check control module in case of inconsistency;

the reading check control module, after the internal enable signal is received, performs a traversal reading operation to the memory row by row, outputs a reading address and a reading clock to the reading control circuit, and outputs the bias switching signal to the signal switching module; while the reading address and the reading clock are output to the reading control circuit, enables the signal switching module to output bias gate voltage Vtest to a gate of the memory cell corresponding to the reading address;

the reading check control module, when the traversal reading operation is performed to the memory row by row, stops the current traversal reading operation and sends a reading check error signal to the reading reference current control module if a reading error signal is received, and otherwise completes the traversal reading operation to all addresses of the memory and outputs a reading check pass signal to the reading reference current control module;

the reading reference current control module, after the internal enable signal is received, sends the central value of the digital regulation signal as a current regulation value to the digital-to-analog conversion module; when the reading check pass signal is received, compares the stored optimum value of the digital regulation signal with the current regulation value, updates the optimum value of the digital regulation signal to the current regulation value if the current regulation value is greater than the optimum value of the digital regulation signal, then increases the current regulation value and sends the current regulation value to the digital-to-analog conversion module; when the reading check error signal is received, decreases the current regulation value and sends the current regulation value to the digital-to-analog conversion module.

2. The reading reference current automatic regulation circuit of the non-volatile memory according to claim 1, wherein the expected value that the readout current is high readout current I0 is '0';

the expected value that the readout current is low readout current I1 is '1';

the high readout current I0 is greater than the reading reference current, and the low readout current I1 is smaller than the reading reference current;

the readout result processing module only determines bits which are 0 of the expected value when the readout value of the memory cell corresponding to the reading address of the current reading operation of the reading check control module is compared with the expected value.

3. The reading reference current automatic regulation circuit of the non-volatile memory according to claim 1, wherein the reading reference current control module adjusts the current regulation value bit by bit based on a bisection method when the reading check pass signal or the reading check error signal is received.

4. The reading reference current automatic regulation circuit of the non-volatile memory according to claim 3, wherein the highest bit of the central value is 1, and other bits are 0;

the initial regulation bit of the current regulation value is the highest bit;

increasing the current regulation value refers to changing the next bit of the current regulation bit of the current regulation value from 0 to 1, the regulation ends if all bits of the current regulation value are 1, and otherwise the next bit is used as the current regulation bit;

decreasing the current regulation value refers to changing the current regulation bit of the current regulation value from 1 to 0 and changing the next bit of the current regulation bit from 0 to 1, the regulation ends if all bits of the current regulation value are 0, and otherwise the next bit is used as the current regulation bit.

5. The reading reference current automatic regulation circuit of the non-volatile memory according to claim 4, wherein the total number of bits of the digital regulation signal is three and the central value is 100.

6. The reading reference current automatic regulation circuit of the non-volatile memory according to claim 1, wherein the reading check control module enables the signal switching module to output the conventional gate voltage to the gate of the memory cell corresponding to the reading address when reading is stopped.

7. The reading reference current automatic regulation circuit of the non-volatile memory according to claim 1, wherein the initial value of the optimum value of the digital regulation signal is 0.

8. The reading reference current automatic regulation circuit of the non-volatile memory according to claim 1, wherein when the reading check error signal is received after the reading reference current control module increases the current regulation value by 1, or when the reading check pass signal is received after the reading reference current control module decreases the current regulation value by 1, the main control module outputs the optimum value of the digital control signal currently stored in the reading reference current control module as a target reading reference current to the outside.

9. The reading reference current automatic regulation circuit of the non-volatile memory according to claim 1, wherein when the reading check error signal is received after the reading reference current control module decreases the current regulation value to 0, the main control module outputs a process failure signal to the outside.

* * * * *